(12) United States Patent
Cho

(10) Patent No.: US 10,852,585 B2
(45) Date of Patent: Dec. 1, 2020

(54) LIGHT DIFFUSING LENS FOR LIGHT EMITTING DEVICE

(71) Applicant: Molex, LLC, Lisle, IL (US)

(72) Inventor: Sung Guk Cho, Hwaseong-si (KR)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 16/669,523

(22) Filed: Oct. 31, 2019

(65) Prior Publication Data

US 2020/0174318 A1 Jun. 4, 2020

(30) Foreign Application Priority Data

Nov. 29, 2018 (KR) .......................... 10-2018-0151425

(51) Int. Cl.
*G02F 1/13357* (2006.01)
*F21V 5/04* (2006.01)
*H01L 33/58* (2010.01)

(52) U.S. Cl.
CPC .......... *G02F 1/133606* (2013.01); *F21V 5/04* (2013.01); *G02F 1/133603* (2013.01); *H01L 33/58* (2013.01); *G02F 2001/133607* (2013.01)

(58) Field of Classification Search
CPC . F21V 5/004; F21V 5/007; F21V 5/04; G02F 2001/133607; H01L 33/58
See application file for complete search history.

(56) References Cited

U.S. PATENT DOCUMENTS

| | | | |
|---|---|---|---|
| 9,217,854 B2 | 12/2015 | Wilcox | |
| 2010/0208171 A1* | 8/2010 | Yamazaki | G02F 1/133603 349/67 |
| 2012/0063150 A1* | 3/2012 | Takeuchi | G09F 9/33 362/308 |
| 2012/0087122 A1* | 4/2012 | Takeuchi | F21V 7/00 362/235 |
| 2013/0229808 A1* | 9/2013 | Wang | G02B 19/0014 362/311.01 |
| 2014/0117394 A1* | 5/2014 | Kim | G02B 19/0061 257/98 |
| 2014/0301085 A1* | 10/2014 | Hwang | H01L 33/405 362/308 |

(Continued)

FOREIGN PATENT DOCUMENTS

| | | |
|---|---|---|
| CN | 203784828 U | 8/2014 |
| CN | 207378753 U | 5/2018 |
| JP | 5081988 B2 | 11/2012 |

*Primary Examiner* — Alexander K Garlen
(74) *Attorney, Agent, or Firm* — Molex, LLC

(57) ABSTRACT

The present disclosure relates to a light diffusing lens for a light emitting device, and the light diffusing lens according to an embodiment of the present disclosure includes: a light entering portion concavely formed on a center of a lower surface of a main body; a light emitting portion formed on an upper surface of the main body in a curved shape; a reflection portion formed on the lower surface of the main body along a circumference of the light entering portion; and a flange protruding outward from a lower end of the light emitting portion along an outer circumference of the main body, wherein the flange has a sheet escape recess formed on a lower portion thereof along a circumferential direction to allow an end of a sheet hole of a reflection sheet to escape thereinto, and is formed to be spaced apart from the reflection portion.

13 Claims, 9 Drawing Sheets

(56) References Cited

U.S. PATENT DOCUMENTS

| | | | |
|---|---|---|---|
| 2015/0009681 A1* | 1/2015 | Takase | G02F 1/133603 362/308 |
| 2015/0042891 A1* | 2/2015 | Shimizu | F21V 5/04 348/725 |
| 2015/0055347 A1* | 2/2015 | Kim | F21K 9/69 362/293 |
| 2015/0219286 A1* | 8/2015 | Yoon | G02B 3/00 362/311.02 |
| 2016/0201875 A1* | 7/2016 | Kang | G02B 19/0061 362/311.06 |
| 2016/0370652 A1* | 12/2016 | Hwang | G02F 1/133605 |
| 2017/0352791 A1* | 12/2017 | Kang | G02B 17/0856 |

* cited by examiner

PRIOR ART

LIGHT DIFFUSING LENS FOR LIGHT EMITTING DEVICE

RELATED APPLICATIONS

This application claims priority to Korean Application No, 10-2018-0151425, filed on Nov. 29, 2018, which application is incorporated herein by reference in its entirety.

TECHNICAL FIELD

The present disclosure relates to a light diffusing lens for a light emitting device.

BACKGROUND ART

A liquid crystal display device (hereinafter, referred to as "LCD") which is a flat panel display device does not emit light by itself unlike other display devices, and necessarily requires a separate external light source to realize an image. Accordingly, the LCD further includes a backlight unit of a surface light source in addition to a liquid crystal panel, and the backlight unit uniformly supplies a light source of high luminance to the liquid crystal panel, thereby realizing an image.

The backlight unit described above refers to a lighting device for realizing an image of a display device such as an LCD, and is divided into an edge lighting type backlight unit or a direct lighting type backlight unit according to a position of a light source. As a light source of the backlight unit, a light emitting diode (hereinafter, referred to as "LED") which has advantages of a compact size, low power consumption, high reliability is mainly used.

The direct lighting type backlight unit has a plurality of LEDs arranged at regular intervals directly under the liquid crystal panel to directly light the liquid crystal panel, and can overcome a difference in light and shade between an edge and a center area, can realize a high-quality image, and in particular, has an advantage of implementing a backlight unit of a large size.

When the LED is used as a light source of the direct lighting type backlight unit, luminance on a portion directly above the LED is high due to the characteristics of a point light source, but luminance abruptly decreases as it is further away from the LED, and there is a problem that overall luminance is not uniform. To solve a difference in luminance, there is a method for reducing a gap between the LEDs. However, as many LEDs are required, a manufacturing cost increases.

To solve this problem, technology for dispersing light by placing a light diffusing lens in each LED is used. The backlight unit using the lens has advantages of solving a difference in luminance between a portion directly above the LED and its periphery, and of relatively reducing the number of LEDs applied by increasing the gap between the LEDs.

FIG. 1 is a cross-sectional view illustrating main components of a related-art direct lighting type backlight unit.

In the backlight unit as shown in the drawing, a light diffusing lens 30 is coupled to a substrate 10 while receiving an LED 20 mounted on the substrate 10 in a light source recess 31, and is configured to allow light of the LED 20 to pass through the light diffusing lens. In addition, a reflection sheet 40 is seated on an upper surface of the substrate 10.

The light diffusing lens 30 has a concave light entering portion 32 formed on a center of a lower surface of a main body 31, has a light emitting portion 33 of a convexly curved shape formed on an upper surface thereof, and has a reflection portion 34 formed on the lower surface thereof. In addition, the light diffusing lens 30 includes a flange 35 protruding outward along an edge of a lower end of the light emitting portion 33. The flange 35 is in contact with or interferes with a neighboring lens, thereby preventing a damage to the light emitting portion 33. In addition, the light diffusing lens 30 has one or more fixing protrusions 36 formed on the lower surface thereof to be coupled to the substrate 10. In addition, the light diffusing lens 30 includes a plurality of pressing protrusions 37 protruding outward and arranged along an outer circumference of the flange 35 at predetermined intervals.

In the backlight unit configured as described above, the LED 20 is mounted on the substrate 10, the light diffusing lens 30 is coupled to the substrate 10 while accommodating the LED 20, and then the reflection sheet 40 is seated on the substrate 10 while exposing the light diffusing lens 30. To achieve this, the reflection sheet 40 includes a plurality of sheet holes formed on positions corresponding to the light diffusing lenses 30.

In this case, a coupling position of the light diffusing lens 30 and a position of the sheet hole of the reflection sheet 40, and sizes (diameters) of these should exactly match each other. When the positions or sizes of the light diffusing lens 30 and the sheet hole do not exactly match each other, an end of the reflection sheet 40 comes into close contact with the pressing protrusion 37 or is pressed by the pressing protrusion 37, and thus partially floats or twists, thereby causing warpage.

The warpage of the reflection sheet 40 may be also occurred by thermal expansion of the reflection sheet 40 caused by heat emitted from the LED module during a driving process of the backlight unit.

The warpage of the reflection sheet 40 may appear as a mottled pattern such as Moire for emitted light, and as a result, may cause degradation of light characteristics.

Since light emitted from the LED is provided to the liquid crystal panel through the lens, there may be a great change in distribution of light emitted through the lens even when there is a slight change in alignment between the LED and the lens, and accordingly, it is more difficult to achieve high-quality backlighting.

The display devices have been enhanced to have high-definition image quality with the trend toward large-size and slim screens, and recent display devices provide resolution ranging from 4K (3840×2160) to 8K (7680×4320).

Accordingly, the backlight unit should provide light of high quality to be applied to a display device providing resolution of 8K or higher. To achieve this, the backlight unit should prevent light damage caused by warpage of the reflection sheet, and should more precisely control light emitting characteristics of light emitted through the lens by controlling alignment between the LED and the lens.

SUMMARY

The present disclosure has been developed to solve the above-described problems, and an object of the present disclosure is to provide a light diffusing lens which can provide light of high quality by preventing warpage of a reflection sheet and preventing damage and a change in light characteristics.

Another object of the present disclosure is to provide a light diffusing lens which can provide light of high quality by exactly controlling alignment with an LED, and precisely controlling light emitting characteristics of emitted light.

A light diffusing lens according to an embodiment of the present disclosure to achieve the above-described objects includes: a light entering portion concavely formed on a center of a lower surface of a main body; a light emitting portion formed on an upper surface of the main body in a curved shape; a reflection portion formed on the lower surface of the main body along a circumference of the light entering portion; and a flange protruding outward from a lower end of the light emitting portion along an outer circumference of the main body, wherein the flange is formed to allow a reflection sheet to be coupled with a predetermined space recessed on a lower end of the flange.

In addition, the flange may include a pressing protrusion protruding outward therefrom.

In addition, the light entering portion may include a first light pattern which is formed along a circumference of an area that light advancing toward a shifted-up area of the flange generated by upward shifting enters, and which changes an advancing direction of light.

In addition, the reflection portion may include an inclined surface which is inclined upward toward an outside.

In addition, the light emitting portion may include a second light pattern which is formed on an upper side of the flange to induce emission of light.

A light diffusing lens according to another embodiment of the present disclosure includes: a light entering portion concavely formed on a center of a lower surface of a main body; a light emitting portion formed on an upper surface of the main body in a curved shape; a reflection portion formed on the lower surface of the main body along a circumference of the light entering portion; and a pressing protrusion protruding outward from a lower end of the light emitting portion, wherein the pressing protrusion has a sheet escape recess formed on a lower portion thereof to allow an end of a sheet hole of a reflection sheet to escape thereinto, and is formed to be spaced apart from the reflection portion.

In addition, the light entering portion may include a first light pattern which is formed along an area that light advancing toward the pressing protrusion enters, and which changes an advancing direction of light.

In addition, the light emitting portion, the pressing protrusion allows the reflection sheet to be coupled with a predetermined space recessed on a lower end of the pressing protrusion.

Advantageous Effects

According to the present disclosure, the end of the sheet hole of the reflection sheet escapes into a lower portion of the flange or the pressing protrusion of the light diffusing lens, such that warpage of the reflection sheet caused by an error or thermal expansion during a manufacturing process can be prevented, and accordingly, degradation of light characteristics can be prevented.

In addition, the present disclosure does not incur a light loss or a difference in luminance caused by shifting of the flange of the light diffusing lens, and thus can maintain light characteristics of high quality.

DETAILED DESCRIPTION OF THE PREFERRED EMBODIMENTS

Figure 1:
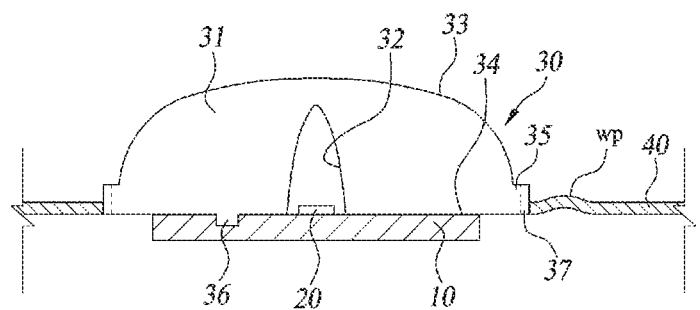
FIG. 1 is a cross-sectional view illustrating main components of a related-art direct lighting type backlight unit.

The present disclosure and the technical objects achieved by embodiments of the present disclosure will be more apparent by preferred embodiments of the present disclosure which will be described below. Hereinafter, preferred embodiments of the present disclosure will be described in detail with reference to the accompanying drawings.

Differences in embodiments described hereinbelow should be understood as not being mutually exclusive. That is, specific shapes, structures, and characteristics described hereinbelow can be implemented in other embodiments in relation to one embodiment without departing from the technical concept and the scope of the present disclosure, and it should be understood that positions or arrangements of individual components within the respective embodiments disclosed herein can be changed. In the drawings, similar reference numerals indicate the same or similar functions in various aspects, and manufacturing raw materials, lengths, areas, and thicknesses, and shapes thereof may be expressed exaggeratedly for convenience.

Figure 2:
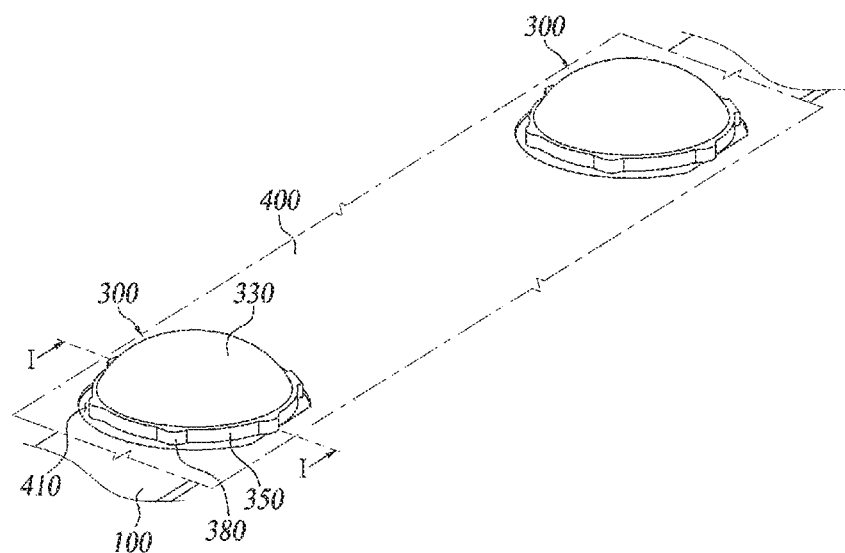
FIG. 2 is a perspective view illustrating main parts of a direct lighting type backlight unit according to the present embodiment.
Figure 3:
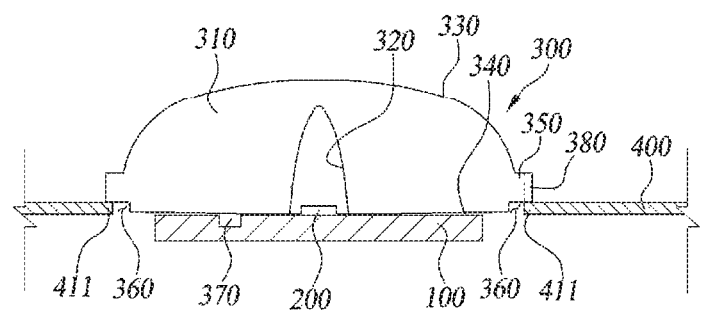
FIG. 3 is a cross-sectional view taken along line I-I of FIG. 2 illustrating the direct lighting type backlight unit.
Figure 4:
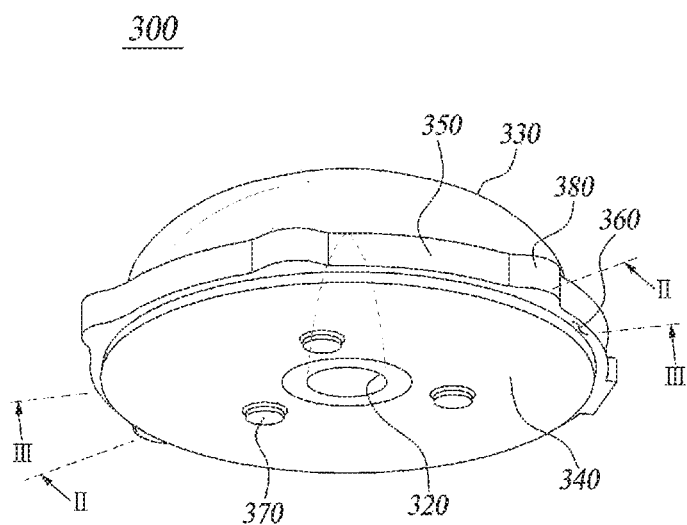
FIG. 4 is a bottom perspective view illustrating a first embodiment of a light diffusing lens which is a main part of FIG. 2.

FIG. 2 is a perspective view illustrating main parts of a direct lighting type backlight unit according to the present embodiment, FIG. 3 is a cross-sectional view taken on line I-I of FIG. 2, illustrating the direct lighting type backlight unit, and FIG. 4 is a bottom perspective view illustrating a first embodiment of a light diffusing lens which is a main part of FIG. 2.

Referring to FIGS. 2 and 3, an LED 200 is mounted on a substrate 100, a light diffusing lens 300 is coupled to the substrate 100 while covering the LED 200, and a reflection sheet 400 is seated on the substrate 100. In addition, the substrate 100 may be accommodated in and fixed to a frame (not shown), and may have a diffusing plate or an optical sheet (not shown) such as a prism sheet stacked on an upper portion thereof spaced apart from the light diffusing lens 300 by a predetermined distance.

Specifically, the substrate 100 may be formed in a bar type or a plate type, and may couple the LED 200, the light diffusing lens 300, and the reflection sheet 400. In addition, the substrate 100 may be formed with a printed circuit board having a predetermined circuit printed thereon to drive the LED 200 mounted thereon, and may have one or more coupling recesses formed on an upper surface thereof to allow the light diffusing lens 300 to be coupled thereto.

The LED 200 is a light source of the backlight unit, and a plurality of LEDs 200 are mounted on the substrate 100 of the bar type at predetermined intervals in a longitudinal direction, or a plurality of LEDs 200 are mounted on the substrate 100 of the plate type at predetermined intervals in a horizontal direction, a vertical direction, a diagonal direction, or a certain direction. The LED 200 may be formed with an element emitting white light, or an element emitting blue light. When the LED 200 is formed with a blue light emitting element, a quantum dot sheet may be disposed on an upper portion of the light diffusing lens 300 to convert blue light into white light.

The light diffusing lens 300 is configured to diffuse light emitted from the LED 200, and is coupled to the substrate 100 while accommodating the LED 200 in a center thereof. A plurality of light diffusing lenses 300 are coupled in a longitudinal direction, a horizontal direction, a vertical direction, a diagonal direction, or a certain direction according to a shape of the substrate 100, while accommodating the respective LEDs 200. The light diffusing lens 300 may be formed with a transparent acrylic resin having a predetermined refractive index, and for example, may use a resin such as polymethylmethacrylate (PMMA), poly styrene (PS), meta styrene (MS), polycarbonate (PC), or the like.

The light diffusing lens 300 of the present embodiment includes a main body 310 formed in a hemispheric shape or a dome shape, a light entering portion 320 concavely formed on a center of a lower surface of the main body 310, a light emitting portion 330 formed on an upper surface of the main body 310, and a reflection portion 340 formed on the lower surface of the main body 310 along the circumference of the light entering portion 320. In addition, the light diffusing lens 300 further includes a flange 350 protruding from a lower end of the light emitting portion 330 along an outer circumference of the main body 310, and a fixing protrusion 370 formed on the lower surface of the main body 310 to be coupled with the substrate 100. A plurality of fixing protrusions 370 may be formed according to positions corresponding to coupling recesses of the substrate 100.

In addition, a plurality of pressing protrusions 380 protruding outward are formed at predetermined intervals along a circumferential direction of the flange 350. The flange 350 or the pressing protrusion 380 allows the reflection sheet 400 to be coupled to a predetermined space which is recessed on a lower end of the flange 350 or the pressing protrusion 380 in a direction from the reflection portion 340 to the light emitting portion 330 and in the circumferential direction when the light diffusing lens 300 is assembled with the reflection sheet 400.

The pressing protrusion 380 prevents the reflection sheet 400 from being separated from the substrate 100 by pressing an end 411 of a sheet hole 410 when the sheet is moved by an external force or thermal expansion after the reflection sheet 400 is assembled.

In addition, a sheet escape recess 360 is formed under the flange 350 and the pressing protrusion 380 to allow the reflection sheet 400 to escape thereinto. That is, the flange 350 is spaced apart from the reflection portion 340 and has the sheet escape recess 360 formed therebetween. The sheet escape recess 360 prevents warpage of the reflection sheet 400 by allowing the end 411 of the sheet hole 410 to escape thereinto when the sheet is moved by an external force or thermal expansion after the reflection sheet 400 is assembled.

In the backlight unit configured as described above, the light diffusing lens 300 is coupled to the substrate 100 to allow the LED 200 mounted on the substrate 100 to be accommodated in the light entering portion 310, and the reflection sheet 400 is seated on the substrate 100 to expose the light diffusing lens 300 through the sheet hole 410. In this case, after the reflection sheet 400 is assembled, the end 411 of the sheet hole 410 escapes into the sheet escape recess 360 under the pressing protrusion 380, and is fixed to the pressing protrusion 380, and thus is prevented from being separated.

Figure 5:
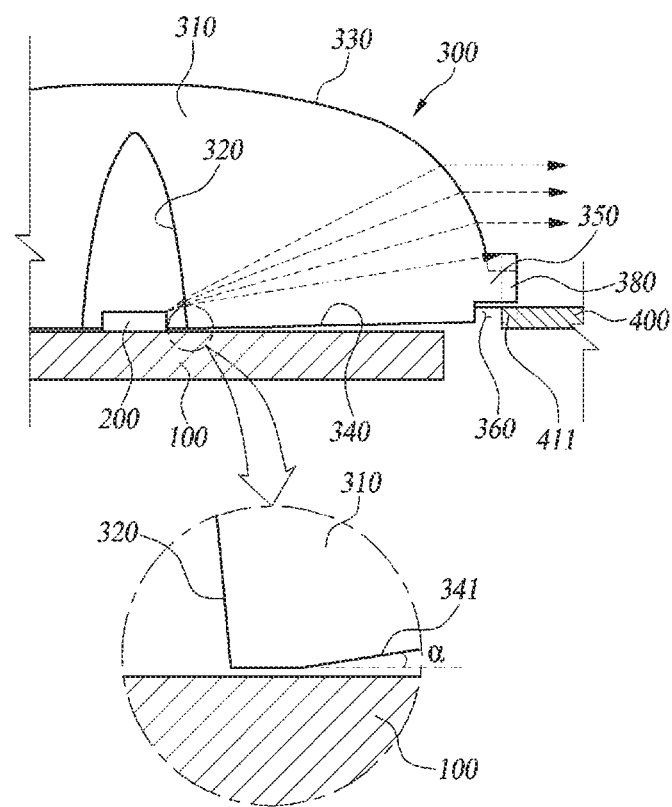
FIG. 5 is a cross-sectional view taken along line II-II of FIG. 4 illustrating a light advancing path of the light diffusing lens.
Figure 6:
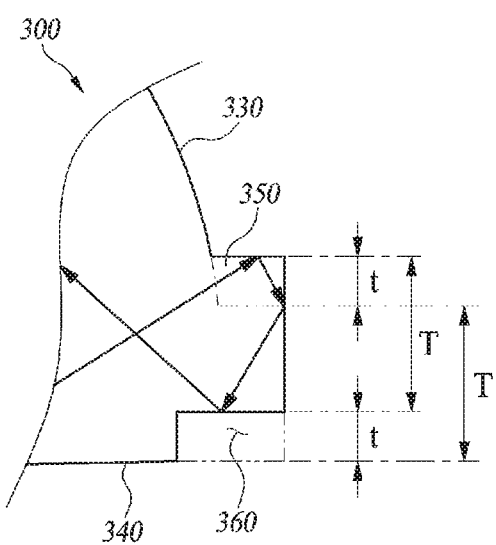
FIG. 6 is an enlarged cross-sectional view taken along line III-III of FIG. 4 illustrating a flange which is a main part of the light diffusing lens.
Figure 7:
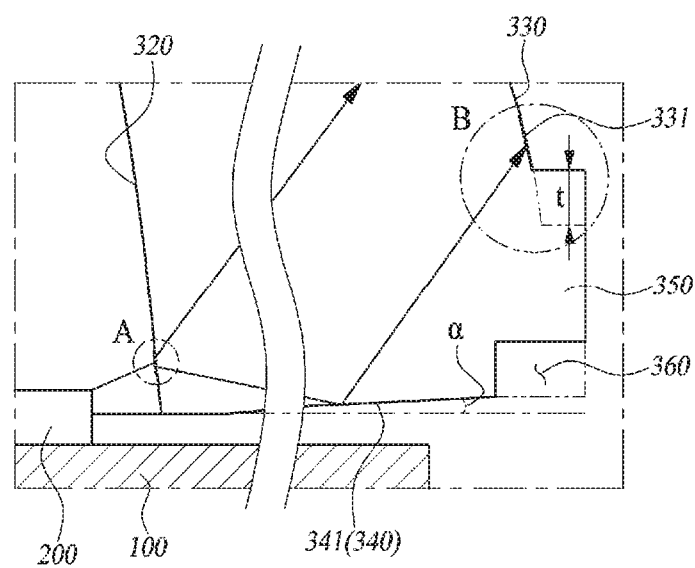
FIG. 7 is a cross-sectional view illustrating a second embodiment of the light diffusing lens.
Figure 8:
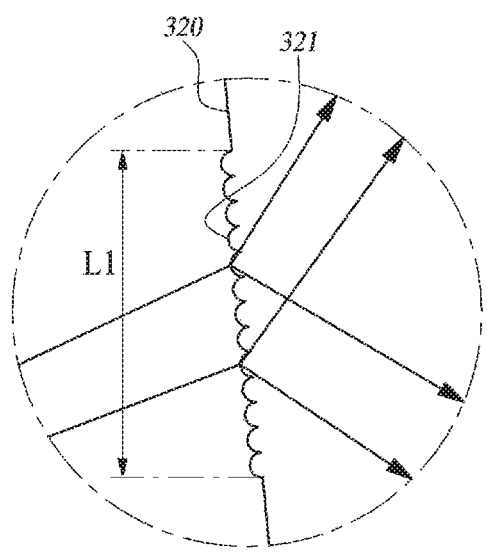
FIG. 8 is an enlarged cross-sectional view of circle A of FIG. 7 illustrating a light entering portion of the light diffusing lens.
Figure 9:
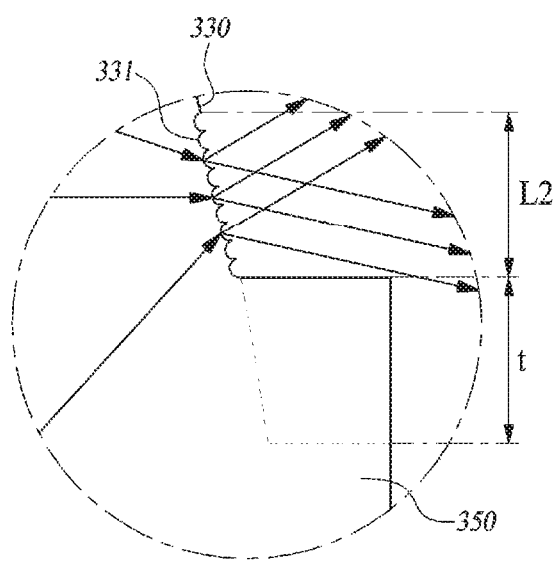
FIG. 9 is an enlarged cross-sectional view of circle B of FIG. 7 illustrating a light emitting portion of the light diffusing lens.

FIG. 5 is a cross-sectional view taken on line II-II of FIG. 4, illustrating a light advancing direction of the light diffusing lens, FIG. 6 is an enlarged cross-sectional view taken on line III-III of FIG. 4, illustrating the flange which is a main part of the light diffusing lens, FIG. 7 is a cross-sectional view illustrating a second embodiment of the light diffusing lens, FIG. 8 is an enlarged cross-sectional view illustrating the light entering portion of the light diffusing lens of FIG. 7, and FIG. 9 is an enlarged cross-sectional view illustrating the light emitting portion of the light diffusing lens of FIG. 7.

First, as shown in FIG. 5, the backlight unit allows light emitted from the LED 200 to enter the inside of the light diffusing lens 300 through the light entering portion 320, to disperse toward edges, and to diffuse and to emit in a lateral direction through the light emitting portion 330. Accordingly, the light diffusing lens 300 disperses light of the LED 200 to have uniform luminance with respect to a center and an outside portion of a light source.

The light diffusing lens 300 of the present embodiment has the sheet escape recess 360 formed under the pressing protrusion 380, and thus the pressing protrusion 380 is shifted upward. As the pressing protrusion 380 is shifted upward, the flange 350 is also shifted toward the light emitting portion 330 disposed thereabove by a predetermined distance, thereby having the sheet escape recess 360 formed on a lower portion thereof.

The flange 350 should have a minimum thickness T to maintain its shape during a manufacturing process using injection, etc. Accordingly, since the thickness T of the flange 350 and the pressing protrusion 380 should not be reduced even when the sheet escape recess 360 is formed on the lower portion of the flange 350 and the pressing protrusion 380, the flange 350 is shifted upward by a height t of the sheet escape recess 360 as shown in FIG. 6.

Due to the upward shifting of the flange 350, the area of the light emitting portion 330 of the light diffusing lens 300 is reduced, and light advancing toward the reduced area t of the light emitting portion 330 (that is, the shifted-up area of the flange) is not emitted to the outside and enters the inside of the flange 350. A part of the light entering the inside of the flange 350 in the shifted-up area t may dissipate inside the flange 350, and a part of the light is totally reflected and is emitted through the light emitting portion 330 on the center area. Accordingly, as the flange 350 is shifted upward, a light loss may occur, causing reduction of luminance, and light is concentrated on the center of the lens and a difference in luminance increases.

The light diffusing lens 300 of the present embodiment prevents a change in light characteristics caused by the shifting of the flange 350. To achieve this, the light diffusing lens 300 induces light to be emitted to the light emitting portion 330 by changing an advancing direction of light that enters the inside of the light diffusing lens 300 and tends to advance toward the shifted-up area t of the flange 350.

Referring to FIGS. 7 and 8, light emitted from the LED 200 enters the inside through the light entering portion 320, and light which tends to advance toward the shifted-up area t of the flange 350 enters through a specific section L1 of the light entering portion 320. The light diffusing lens 300 of the present embodiment forms a first light pattern 321 in the section L1 of the light entering portion 320, and the first light pattern 321 changes an advancing direction of entering light, and in particular, changes a direction of light advancing toward the shifted-up area t of the flange 350.

The first light pattern 321 is formed in a section including the specific section L in which entering light advances toward the shifted-up area of the flange 350, and is formed in a ring shape along an inner circumference of the light entering portion 320. In addition, the first light pattern 321 may be formed in a convex or concave structure, or may be formed in a concave-convex structure in which convex and concave structures are repeated, and may have various shapes such as a lens-like shape, a pyramidal shape, or a prism shape.

Referring to FIG. 8, light passing through the area of the light entering portion 320 on which the first light pattern 321 is formed scatters. In this case, a part of the light advances toward the light emitting portion 330 and is directly emitted to the outside, and a part of the light advances toward the reflection portion 340, is reflected, and is emitted to the light emitting portion 330. Accordingly, since light advancing toward the flange 350 of the shifted-up area t is emitted through the light emitting portion 300 by the first light pattern 321, a light loss can be prevented and increase of a difference in luminance can be suppressed.

In addition, as shown in FIGS. 5 and 7, the reflection portion 340 of the light diffusing lens 300 may include an inclined surface 341. The inclined surface 341 is configured to be inclined upward by a predetermined angle α to the outside from a position adjacent to the light entering portion 320 or spaced apart therefrom The inclined surface 341 reflects light refracted downward by the first light pattern 321 toward the light emitting portion 330 disposed thereabove. In addition, the inclined surface 341 forms a gap with the substrate disposed thereunder, and provides a heat radiation path through which heat generated in the LED 200 is discharged. Accordingly, the inclined surface 341 prevents reduction of a life span of the LED 200 element, and prevents deformation of the light diffusing lens 300 and the reflection sheet 400 caused by heat generated in the LED 200. The inclined surface 341 may be formed on the entire area of the lower surface of the light diffusing lens 300 or may be formed on some areas, and a plurality of inclined surfaces 341 may be repeatedly formed.

Referring to FIGS. 7 and 9, the light diffusing lens 300 of the present embodiment may have a second light pattern 331 formed on the light emitting portion 330. Light entering the inside of the light diffusing lens 300 is distributed over the entire area of the inside of the lens while repeating total reflection along the surface of the lens, and simultaneously, is emitted through the light emitting portion 330 as a uniform light source. In this case, a total reflection condition is destroyed in the second light pattern 331 and a relatively large amount of light is emitted.

The area of the light emitting portion 330 is reduced due to the shifted-up area of the flange 350 of the light diffusing lens 300, and in particular, luminance in the lateral direction is reduced. Accordingly, the second light pattern 331 induces light distributed over the inside of the lens to be emitted in the lateral direction, thereby compensating for reduction of luminance caused by the upward shifting of the flange 350.

The second light pattern 331 may be formed in an area including a specific section L2 of the light emitting portion 330 adjacent to or spaced apart from the flange 350, and is formed along the circumference of the surface of the light emitting portion 330 in a ring shape. In this case, the section L2 in which the second light pattern 331 is formed may be a section corresponding to the shifted-up area t of the flange 350. In addition, the second light pattern 331 may be formed in a convex or concave structure, or may be formed in a concave-convex structure in which convex and concave structures are repeated, and may have various shapes such as a lens-like shape, a pyramidal shape, or a prism shape.

Figure 10:
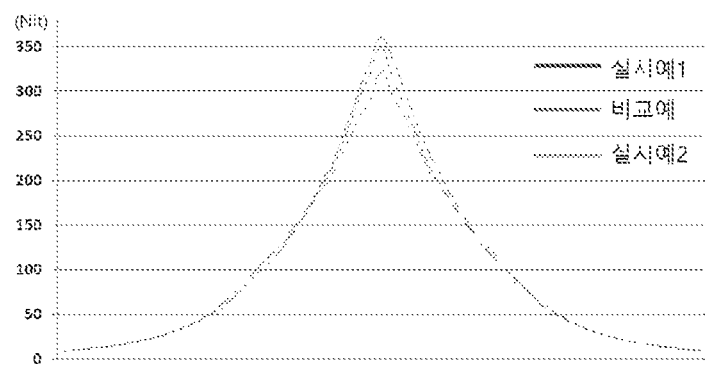
FIG. 10 is a view illustrating light characteristics of the related-art light diffusing lens and the light diffusing lens according to the present embodiment.

FIG. 10 is a view illustrating light characteristics of the related-art light diffusing lens and the light diffusing lens according to the present embodiment.

In a light characteristic experiment of FIG. 10, light characteristics in the case of a light diffusing lens (comparison example) in which a sheet escape recess is not formed, light characteristics in the case of a light diffusing lens (first example) in which a sheet escape recess is formed, and light characteristics in the case of a light diffusing lens (second example) in which both a sheet escape recess and a first light pattern are formed were identified, and luminance characteristics from the center of the lens to the edges are illustrated by graphs.

Referring to the drawing, it can be seen that luminance on the center is relatively high in the case of the light diffusing lens of the first example in which the sheet escape recess is formed (that is, the light diffusing lens having the flange shifted upward), in comparison to the comparison example. However, it can be seen that in the case of the light diffusing lens in which the sheet escape recess is formed on the lower surface of the lens and the first light pattern is formed in a specific area of the light entering portion as in the second example, luminance on the center is relatively low and luminance on edges is substantially the same as in the comparison example and is higher than in the first example.

Accordingly, the light diffusing lens of the present embodiment prevents light from being concentrated on the center while maintaining overall luminance, and also, has an effect of dispersing light toward edges.

Figure 11:
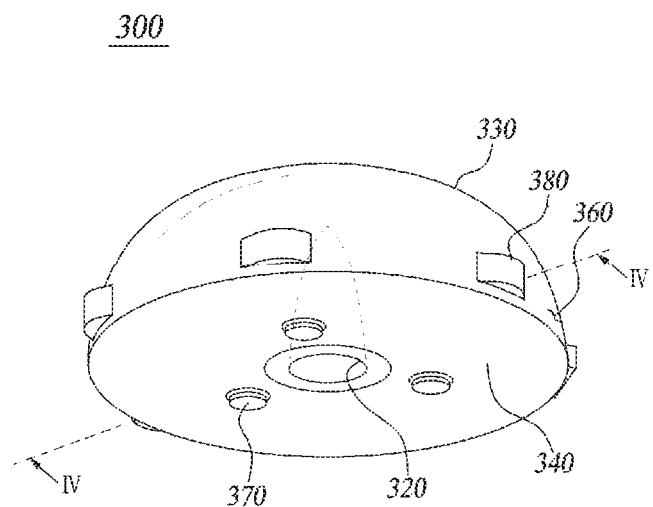
FIG. 11 is a cross-sectional view illustrating a third embodiment of the light diffusing lens.
Figure 12:
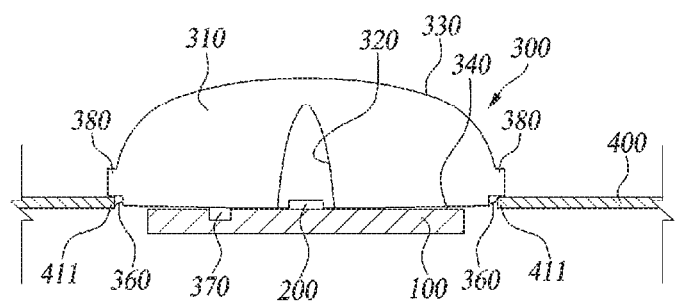
FIG. 12 is a cross-sectional view taken along line IV-IV of FIG. 11 illustrating a backlight unit to which the light diffusing lens of FIG. 11 is applied.

FIG. 11 is a cross-sectional view illustrating a third embodiment of the light diffusing lens, and FIG. 12 is a cross-sectional view illustrating a backlight unit to which the light diffusing lens of FIG. 11 is applied.

Referring to FIG. 11, the light diffusing lens of the present embodiment has a pressing protrusion 380 directly formed on the main body. That is, the pressing protrusion 380 protrudes outward from a lower end of the light emitting portion 330, and a plurality of pressing protrusions 380 are formed at predetermined intervals along the circumference. In this case, the pressing protrusion 380 is formed at a position shifted upward from the reflection portion 340, and has the sheet escape recess 360 formed on a lower portion thereof.

Accordingly, as shown in FIG. 12, the end 411 of the sheet hole of the reflection sheet 400 is inserted into the sheet escape recess 360 and is fixed to the pressing protrusion 380.

The first light pattern 321 (see FIG. 8) may be formed on the light entering portion 320, and the first light patterns 321 may be formed on positions corresponding to the pressing protrusions 380 while forming predetermined intervals along the circumference of the light entering portion 320. In this case, the first light pattern 321 allows light to be emitted through the light emitting portion 330 by changing a direction of light advancing toward the pressing protrusion 380.

In addition, the second light pattern 331 (see FIG. 9) may be formed on the light emitting portion 330, and the second light patterns 331 may be formed along a circumference including an upper side of the pressing protrusion 380. The second light pattern 331 can prevent reduction of luminance caused by the pressing protrusion 380 by inducing emission of light.

Although exemplary embodiments of the present disclosure have been illustrated and described as above, various changes and other embodiments can be implemented by those skilled in the art. It should be noted that such changes and other embodiments are considered and included in the appended claims, and do not depart from the genuine purpose and the scope of the present disclosure.

The invention claimed is:

1. A light diffusing lens for a light emitting device, the light diffusing lens comprising:
    a main body having a lower surface and an upper surface, wherein the lower surface has a light entering portion and a reflection portion, the light entering portion being formed about a center thereof, the light entering portion being concavely formed, the reflection portion extending from a circumference of the light entering portion to a circumference of a lower edge of the upper surface,
    wherein the upper surface has a light emitting portion, a flange, and a lower end portion, the light emitting portion formed about a center thereof, the light emitting portion being concavely formed, the lower end portion extending upwardly from the lower edge of the upper surface to an upper edge thereof, the flange protruding outwardly in a circumferential manner from between a lower edge of the light emitting portion and the upper edge of the lower end portion, the flange defining a lower surface which is connected to the lower end portion, an upper surface which is connected to the light emitting portion, and an outward circumferential surface which connects the upper and lower surfaces,
    wherein a recess is defined below the lower surface of the flange and outward from the lower end portion, the recess being configured to allow a reflection sheet to be positioned therein and to be coupled to the lower surface of the flange;
    wherein the flange has at least one pressing protrusion protruding outwardly from the outward circumferential surface, wherein the recess is defined below the lower surface of the flange, below a lower surface of the at least one pressing protrusion, and outward from the lower end portion, the recess being configured to allow a reflection sheet to be positioned therein and to be coupled to the lower surface of the at least one pressing protrusion.

2. The light diffusing lens as defined in claim 1, wherein the light entering portion has a portion thereof which advances a first portion of light toward the light emitting portion and a second portion of the light toward the reflection portion.

3. The light diffusing lens as defined in claim 2, wherein the first light pattern is provided along an inner circumference of the light entering portion proximate to the connection of the light entering portion and the reflection portion.

4. The light diffusing lens as defined in claim 3, wherein the first light pattern is formed in one of a convex, concave or repeating concave-convex structure.

5. The light diffusing lens as defined in claim 3, wherein the first light pattern is formed in one of a lens-like shape, a pyramidal shape or a prism shape.

6. The light diffusing lens as defined in claim 2, wherein the reflection portion comprises an inclined surface which is inclined upward toward the lower edge of the upper surface.

7. The light diffusing lens as defined in claim 6, wherein the second portion of light that is advanced toward the reflection portion is reflected to a portion of the light emitting portion that is adjacent to or spaced apart from the upper surface of the flange, which portion is modified by a second light pattern to emit the second portion of the light in a lateral direction.

8. The light diffusing lens as defined in claim 7, wherein the second light pattern is provided along an inner circumference of the light emitting portion.

9. The light diffusing lens as defined in claim 7, wherein the second light pattern is formed in one of a convex, concave or repeating concave-convex structure.

10. The light diffusing lens as defined in claim 7, wherein the second light pattern is formed in one of a lens-like shape, a pyramidal shape or a prism shape.

11. The light diffusing lens as defined in claim 2, wherein the second portion of light that is advanced toward the reflection portion is reflected to a portion of the light emitting portion that is adjacent to or spaced apart from the upper surface of the flange, which portion is modified by a second light pattern to emit the second portion of the light in a lateral direction.

12. The light diffusing lens as defined in claim 1, wherein the lower end portion is formed as a part of the light emitting portion.

13. An assembly comprising:
    a substrate having a surface;
    an LED mounted on the surface of the substrate;
    a light diffusing lens comprising a main body having a lower surface and an upper surface, the lower surface having a light entering portion and a reflection portion, the light entering portion being formed about a center thereof, the light entering portion being concavely formed, the reflection portion extending from a circumference of the light entering portion to a circumference of a lower edge of the upper surface, the reflection portion being coupled to the substrate of the surface, the LED being positioned below the light entering portion, the upper surface having a light emitting portion, a flange, and a lower end portion, the light emitting portion formed about a center thereof, the light emitting portion being concavely formed, the lower end portion extending upwardly from the lower edge of the upper surface to an upper edge thereof, the flange protruding outwardly in a circumferential manner from between a lower edge of the light emitting portion and the upper edge of the lower end portion, the flange defining a lower surface which is connected to the lower end portion, an upper surface which is connected to the light emitting portion, and an outward circumferential surface which connects the upper and lower surfaces, wherein a recess is defined that is bounded by the surface of the substrate, the lower surface of the flange and the lower end portion; and
    a reflection sheet coupled to the surface of the substrate, wherein an end of the reflection sheet is positioned within the recess and is further coupled to the lower surface of the flange;
    wherein the flange has at least one pressing protrusion protruding outwardly from the outward circumferential surface, wherein the recess is defined below the lower surface of the flange, below a lower surface of the at least one pressing protrusion, and outward from the lower end portion, the recess being configured to allow a reflection sheet to be positioned therein and to be coupled to the lower surface of the at least one pressing protrusion.

\* \* \* \* \*